United States Patent [19]
Poingt et al.

[11] Patent Number: 5,385,636
[45] Date of Patent: Jan. 31, 1995

[54] METHOD OF FORMING A METAL CONTACT ON A PROJECTION ON A SEMICONDUCTOR SUBSTRATE

[75] Inventors: Francis Poingt, Ste Genevieve des Bois; Elisabeth Gaumont-Goarin, Montrouge; Lionel Le Gouezigou, Le Val St Germain, all of France

[73] Assignee: Alcatel N.V., Amsterdam, Netherlands

[21] Appl. No.: 203,301

[22] Filed: Mar. 1, 1994

[30] Foreign Application Priority Data

Mar. 5, 1993 [FR] France ............................. 93 02577

[51] Int. Cl.$^6$ ........................................ H01L 21/312
[52] U.S. Cl. ................................. 156/649; 156/660; 156/634; 156/652
[58] Field of Search ............... 156/664, 660, 649, 634, 156/652; 437/228, 229, 245, 246

[56] References Cited

U.S. PATENT DOCUMENTS

| | | | |
|---|---|---|---|
| 3,721,592 | 3/1973 | De Werdt | 156/11 |
| 4,680,085 | 7/1987 | Vijan | 156/649 |
| 4,788,159 | 11/1988 | Smith | 437/90 |
| 5,084,409 | 1/1992 | Beam | 437/90 |
| 5,283,209 | 2/1994 | Poingt et al. | 437/228 |

FOREIGN PATENT DOCUMENTS 58-184763  1/1984  Japan .

*Primary Examiner*—R. Bruce Breneman
*Assistant Examiner*—Joni Y. Chang
*Attorney, Agent, or Firm*—Sughrue, Mion, Zinn, Macpeak & Seas

[57] ABSTRACT

A metal contact is formed by etching a metal film that is locally protected by a spot of photosensitive resin. Thereafter the resin is caused to flow in the presence of vapor of a solvent for the resin, so as to form a protective spot of increased size. This larger spot makes it possible to etch the semiconductor substrate while ensuring that the projection formed in this way is automatically aligned relative to the metal contact. The resin remains photosensitive, thereby enabling subsequent etching. The invention is particularly applicable to the manufacture of avalanche diodes.

3 Claims, 4 Drawing Sheets

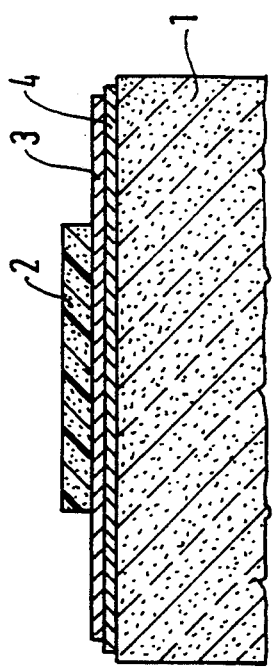
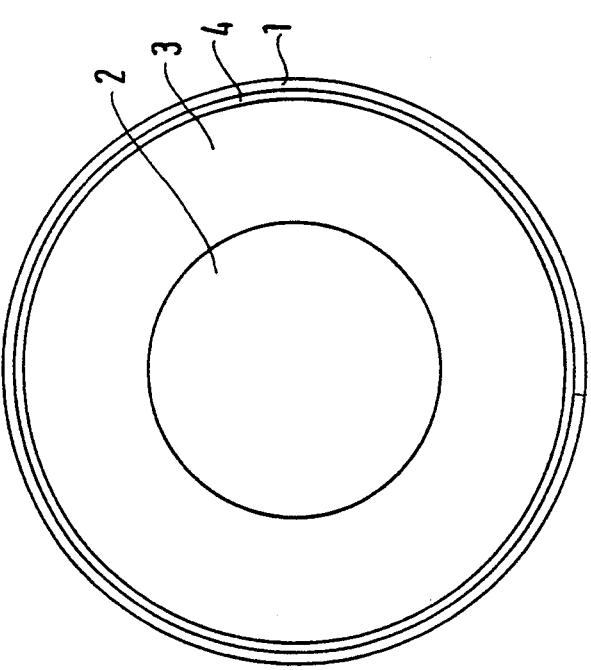
FIG.1A
FIG.1B
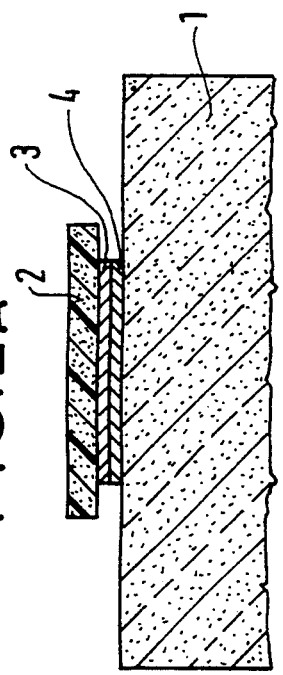
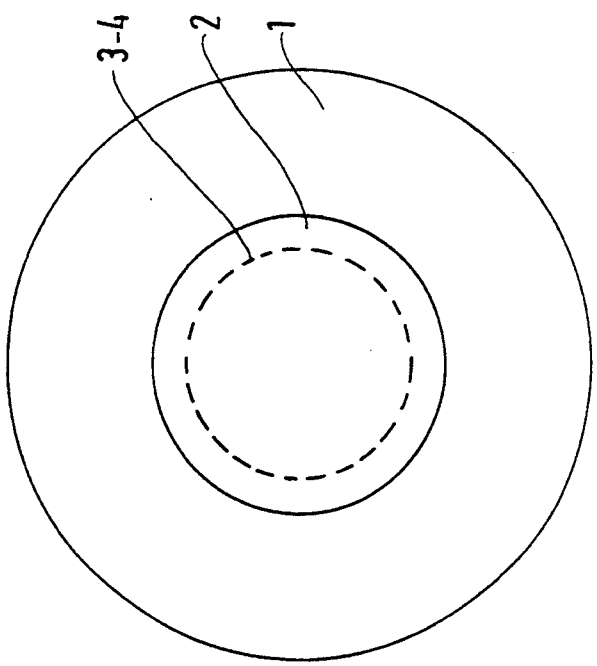
FIG.2A
FIG.2B

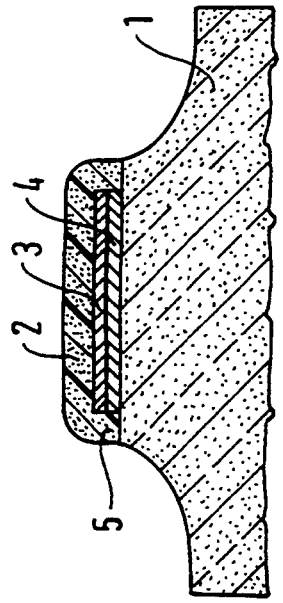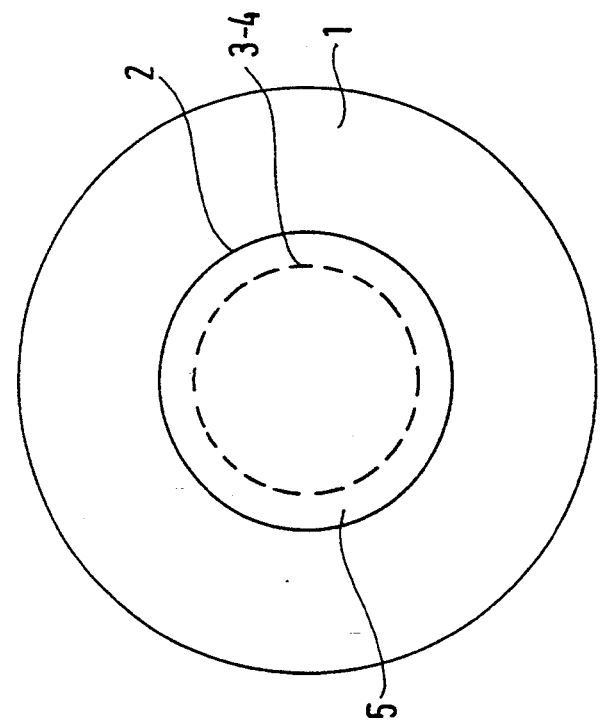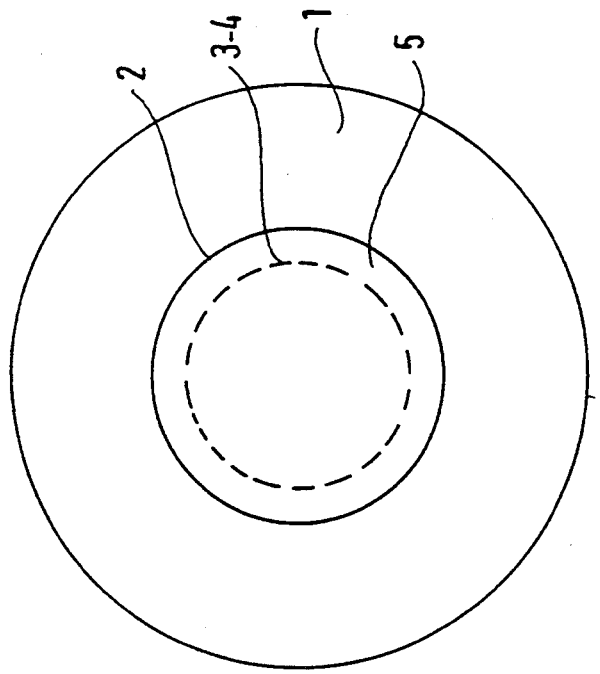

METHOD OF FORMING A METAL CONTACT ON A PROJECTION ON A SEMICONDUCTOR SUBSTRATE

FIELD OF THE INVENTION

The present invention relates to forming or positioning a metal contact on a projection on a semiconductor substrate by means of a method, in which:
a) a metal film is deposited on the semiconductor substrate, and then a spot of photosensitive resin is deposited on the substrate;
b) the metal film around the zone protected by the spot of photosensitive resin is etched;
c) the photosensitive resin is caused to flow around the protected zone so as to come into contact with the semiconductor substrate; and
d) the semiconductor substrate is subjected to etching all around the zone protected by the spot of photosensitive resin.

BACKGROUND OF THE INVENTION

Proposals have already been made in document JP-A-58/184763 for a method of this kind in which photosensitive resin is caused to flow around the zone that is protected by the spot of said resin by means of heat treatment at quite a high temperature (about 170° C.) over a considerable period of time (several tens of minutes). However, it is difficult to control the length of resin flow accurately, and the treated resin loses its photosensitivity. It is therefore not possible to subject it to further treatment, e.g. to form an opening in the spot to make contact with the substrate or to make an irradiation window. Furthermore, since the treated resin is cross-linked, it can be removed only by means of a special solvent.

OBJECTS AND SUMMARY OF THE INVENTION

An object of the present invention is to provide a method of automatically aligning a metal contact on a substrate of semiconductor material which enables the zone protected by the photosensitive resin after it has flowed to be defined with greater accuracy, the definition being obtained by an operation that is very rapid and with the help of an ordinary solvent, while leaving intact the photosensitive properties of the resin so as to make subsequent treatment thereof possible According to the method of the invention the photosensitive resin is caused to flow by passing it for a short period of time in contact with vapor of a solvent for the resin.

Preferably it also satisfies at least one of the following characteristics:
the substrate coated with the metal contact and with the resin spot is placed for a short period of time in an enclosure under an atmosphere saturated with vapor of the solvent;
the etching of the metal film is continued until the remaining edge of said film is set back relative to the edge of the spot of photosensitive resin; and
the semiconductor material is subjected to etching, thereby automatically aligning a projection formed by the zone of said material that has been protected from said etching by the spot of resin. Thereafter, an opening is formed through the zone marked by the spot of photosensitive resin in order to allow light to reach a photodiode or to make contact with the substrate of semiconductor material. For this purpose, a mask is placed over said spot, the mask being pierced, for example, with an opening that coincides with the opening that is to be made in the metal film, the photosensitive resin is subjected to radiation through said opening, and the irradiated resin is removed, after which the underlying metal is removed.

BRIEF DESCRIPTION OF THE DRAWINGS

A method in accordance with the invention for automatically aligning a metal contact is described below by way of example and with reference to the figures of the accompanying drawings.

FIGS. 1A and 1B are respectively a section in a vertical plane and plan view of a spot of photosensitive resin deposited on a metal film covering a semiconductor substrate.

FIGS. 2A and 2B are respectively a vertical section and a plan view of the device of FIGS. 1A and 1B after the metal film has been etched with acid, with deliberate excess etching to ensure that the edge of the metal disk that remains beneath the spot of photosensitive resin is set back relative to the edge thereof.

FIGS. 3A and 3B are respectively a vertical section and a plan view of the device after the spot of photosensitive resin has been caused to flow by being treated with a solvent.

FIGS. 4A and 4B are respectively a vertical section and a plan view through the device having the spot of photosensitive resin, after the semiconductor substrate has been etched around the zone that is protected by the spot of resin.

MORE DETAILED DESCRIPTION

Figure 5:
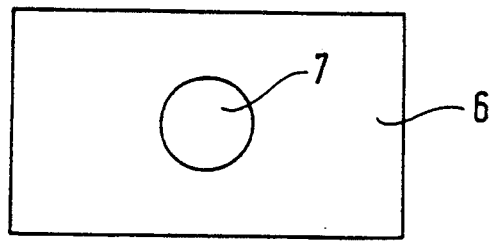
FIG. 5 shows a mask for applying to the device of FIGS. 4A and 4B in order to form an opening to constitute a contact or an illumination window.

In FIGS. 1A and 1B, the semiconductor substrate 1 is covered firstly with a film of metallization comprising a layer of titanium 3 and a layer of gold 4. A spot of photosensitive resin 2 having a diameter that is slightly greater than the diameter of the desired metal contact is placed on the film of metallization.

FIGS. 2A and 2B show the same device after the metallization has been etched with acid, with deliberate excess etching to cause the diameter of the remaining metal contact to be smaller than the diameter of the spot of photosensitive resin, the edge of the metal contact then being set back from the edge of the spot of resin, so as to facilitate the following operation.

FIGS. 3A and 3B show the device after the resin has been caused to flow by passing the device into a closed enclosure and subjecting it to a flow of vapor from a solvent such as acetone for a period of several minutes. The spot of photosensitive resin (whose thickness is naturally reduced) sags down around its edges to form a ring 5 in contact with the substrate 1.

As shown in FIGS. 4A and 4B, when the semiconductor substrate is etched by conventional mechanisms, such etching takes place only around the edges 5 of the spot of photosensitive resin.

Figure 6A:
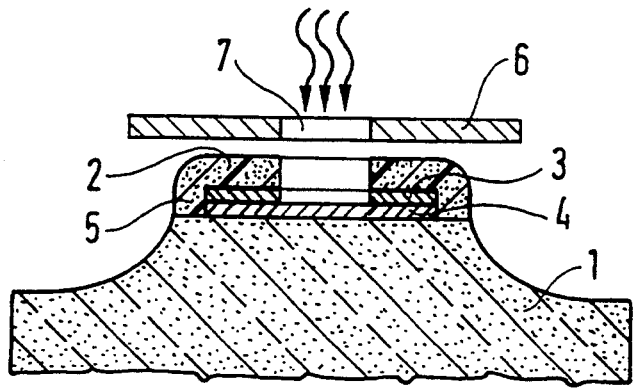
FIGS. 6A and 6B are a vertical section and a plan view of the device after the photosensitive resin has been irradiated by light radiation, and after the irradiated resin has been removed.
Figure 6B:
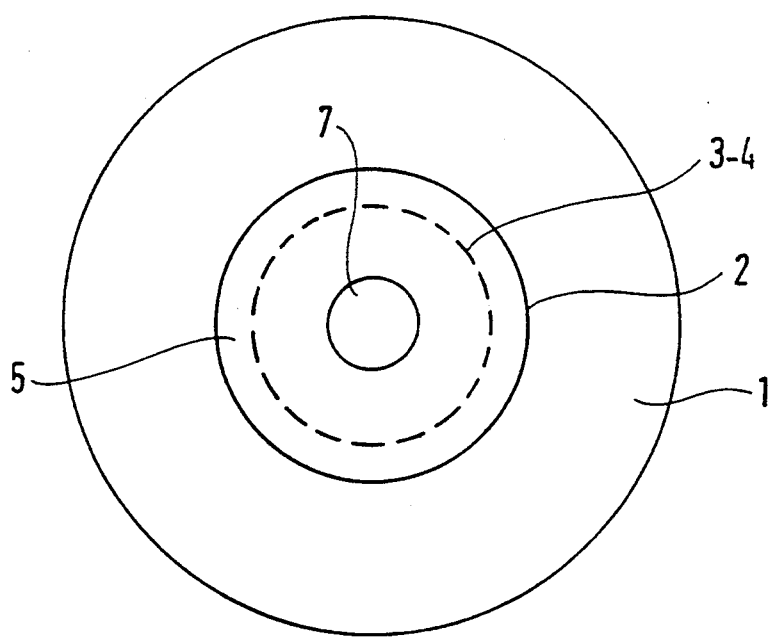

When it is desired to form a contact and/or an illumination window through the spot of photosensitive resin, a second mask 6 having an opening 7 (FIG. 5) is placed over said spot. The photosensitive resin is then subjected to light radiation through the opening 7 in the mask 6 (FIGS. 6A and 6B) after which the irradiated resin is removed by means of a solvent or by some other known method (oxygen plasma).

Figure 7A:
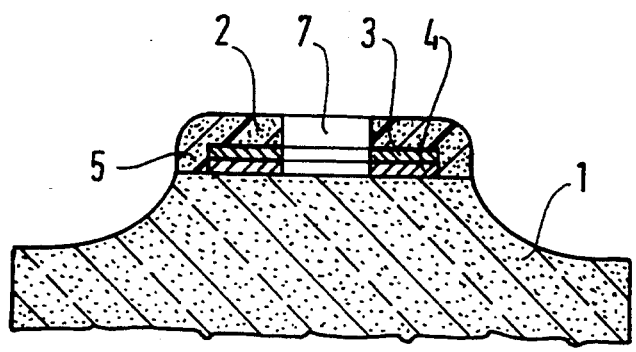
FIGS. 7A and 7B are a vertical section and a plan view of the device after the metal layer in the opening has been removed for the purpose of receiving a contact or of forming an illumination window.
Figure 7B:
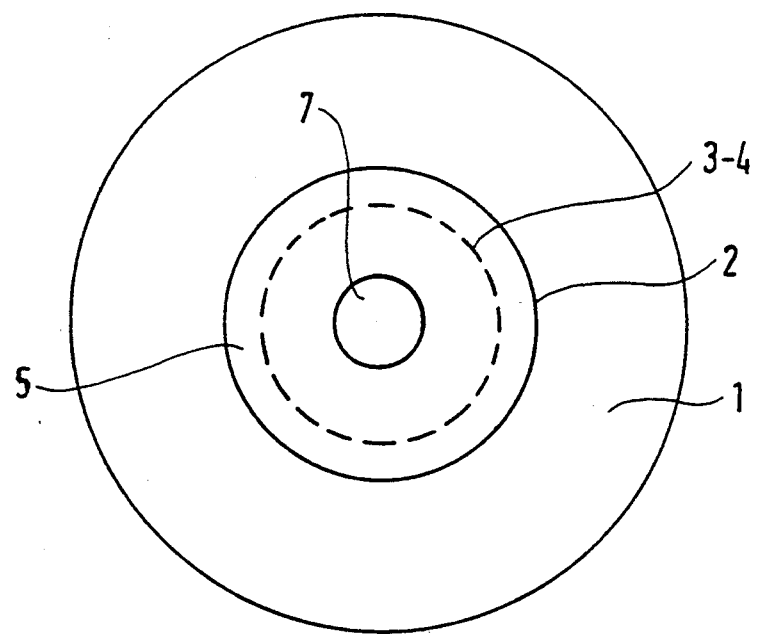

The metallization on the semiconductor substrate is then subjected to acid etching in order to clear the contact zone and/or the illumination window 7 (in particular when forming a contact and an illumination window for a "mesa" photodiode that is illuminated via its front face). The device shown in FIGS. 7A and 7B is thus obtained.

Although the method of the invention is described above with reference to the figures in the context of making a circular metal contact, it will be understood that it is just as applicable to making contacts of other geometrical shapes, in particular longitudinal contacts on a ribbon.

The method of the invention is also applicable to manufacturing avalanche photodiodes or laser diodes, and more generally to any semiconductor component (emitter, detector, or receiver) whose manufacture requires automatic alignment.

We claim:

1. A method of forming a metal contact on projection on a semiconductor substrate, in which:

a) a metal film is deposited on the semiconductor substrate, and then a spot of photosensitive resin is deposited on a zone of the substrate that is to be protected;
 b) the metal film around the zone protected by the spot of photosensitive resin is etched;
 c) the photosensitive resin is caused to flow around the protected zone so as to come into contact with the semiconductor substrate; and
 d) the semiconductor substrate is subjected to etching all around the zone protected by the spot of photosensitive resin, in such a manner as to form said projection;

wherein the photosensitive resin is caused to flow by passing it for a short period of time in contact with vapor of a solvent for the resin; and wherein an opening is formed in the metal film in the zone protected by the spot of photosensitive resin by placing over the spot a mask defining the opening to be made, by subjecting the photosensitive resin to radiation through said mask, and by performing a selective ablation treatment to remove the resin in the opening defined in this way, and then by etching the metal underlying said opening.

2. A method according to claim 1, wherein the metal contact is placed for a short period of time in an enclosure under an atmosphere saturated with vapor of the solvent.

3. A method according to claim 1, wherein the etching of the metal film is continued until the remaining edge of said film is set back relative to the edge of the spot of photosensitive resin.

* * * * *